Figure 1:
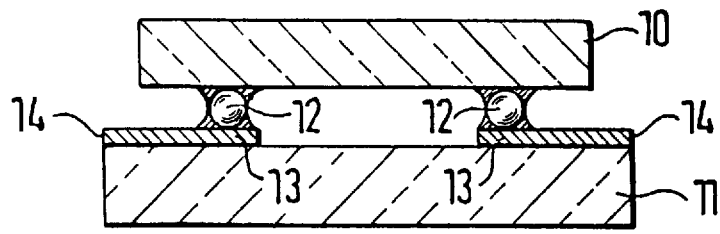

United States Patent

Gademann et al.

Patent Number: 5,866,951
Date of Patent: Feb. 2, 1999

[54] HYBRID CIRCUIT WITH AN ELECTRICALLY CONDUCTIVE ADHESIVE

[75] Inventors: Lothar Gademann, Rottenburg; Peter Flohrs; Juergen Hartmann, both of Reutlingen, all of Germany

[73] Assignee: Robert Bosch GmbH, Stuttgart, Germany

[21] Appl. No.: 39,120

[22] Filed: Apr. 12, 1993

[30] Foreign Application Priority Data

Oct. 12, 1990 [DE] Germany ............ 40 323 97.8
Oct. 9, 1991 [WO] WIPO .......... PCT/DE91/00789

[51] Int. Cl.$^6$ ............ H01L 23/48; H01L 23/52; H01L 29/40
[52] U.S. Cl. ............ 257/783; 257/782; 257/786
[58] Field of Search .......... 257/706, 707, 257/705, 783, 782, 786, 778

[56] References Cited

U.S. PATENT DOCUMENTS

| | | | |
|---|---|---|---|
| 3,292,240 | 12/1966 | McNutt | 29/155.5 |
| 3,303,393 | 2/1967 | Hymes | 317/101 |
| 3,517,279 | 6/1970 | Ikeda | 317/234 |
| 3,657,610 | 4/1972 | Yamamoto et al. | 257/778 |
| 3,871,014 | 3/1975 | King et al. | |
| 4,442,966 | 4/1984 | Jourdain | 228/123 |
| 4,647,959 | 3/1987 | Smith | 757/783 |
| 5,001,542 | 3/1991 | Tsukagoshi et al. | 757/783 |
| 5,068,714 | 11/1991 | Seipler | 357/80 |
| 5,444,301 | 8/1995 | Song et al. | |

FOREIGN PATENT DOCUMENTS

| | | |
|---|---|---|
| 0 265 077 | 4/1988 | European Pat. Off. |
| 2 492 164 | 4/1982 | France |
| 26 58 302 | 7/1977 | Germany |
| 52-77684 | 6/1977 | Japan ............ 257/782 |
| 1 525 148 | 9/1978 | United Kingdom |

OTHER PUBLICATIONS

M. Hof, "Klebetechniken in der Mikroelectronik," [Adhesion Techniques in Microelectronics], in Feinwerktechnik+ Messtechnik vol. 92, No. 2, pp. 67–69 (Munich, Germany, Mar. 1984).

*Primary Examiner*—Carl W. Whitehead, Jr.
*Assistant Examiner*—S. V. Clark
*Attorney, Agent, or Firm*—Frishauf, Holtz, Goodman, Langer & Chick, P.C.

[57] ABSTRACT

The composite hybrid semiconductor structure contains a support plate substrate (11) with a number of at least two support connector spots (13) and a semiconductor chip or semiconductor wafer substrate (10) with a number of at least two chip connector spots (16). The structures is distinguished by a respectively thermally and electrically conducting adhesive layer (13') on the surface of the support plate substrate (11) within the areas of the support connector spots (13), where the said substrates (10, 11) with the said connector spots (13, 16) placed opposite each other and in electrically conducting and mechanically firm connection have been brought into connection with each other by the said electrically conductive adhesive layers (13').

1 Claim, 3 Drawing Sheets

HYBRID CIRCUIT WITH AN ELECTRICALLY CONDUCTIVE ADHESIVE

FIELD OF THE INVENTION

The invention relates to a method for producing a hybrid semiconductor structure.

BACKGROUND

Methods for producing hybrid semiconductor structures having a support plate structure on which a semiconductor chip is located are already known from U.S. Pat. No. 3,292,240 and from U.S. Pat. No. 3,303,393. The connection of a semiconductor substrate on a support plate substrate is formed by spherical metal contacts, which are soldered with the use of lead-tin soft solder to the chip connector spots of the semiconductor chip substrate on the one side and to the associated support connector spots of the support plate substrate on the other.

In accordance with U.S. Pat. No. 3,517,279, a further embodiment of this known method of the co-called flip-chip technology consists in that the metal spheres are omitted and that a soft solder layer is applied to the chip connector spots and/or the support connector spots and the semiconductor structure is soldered with the aid of this soft solder layer alone in accordance with the reflow soldering method.

It is furthermore known from DE-AS 16 14 374 to apply a passivation layer to a least a portion of the surface of a semiconductor chip substrate provided with metallic connector spots.

A disadvantage of the known method of the flip-chip technology lies in that it is difficult to apply the soft solder to the chip connector spots and/or the support connector spots in a suitable amount, as well to retain it there during melting, with which a reliable mechanical and electrically conductive connection between the respective connector spots is achieved on the one hand and, on the other, short-circuiting of adjacent connector spots is prevented. A further disadvantage consists in that with semiconductor chip or semiconductor wafer substrates with large surfaces the hybrid semiconductor structure is subjected to shear loads on account of the different thermal expansion of the two substrates.

SUMMARY OF THE INVENTION

In contrast thereto, the structure of the invention with the characterizing features of the main claim has the advantage that, because of the resilience of an electrically and thermally conducting adhesive layer used, between the respective substrates even semiconductor chip or semiconductor wafer substrates with large surfaces can be placed in a hybrid semiconductor structure without shear loads, caused by the different thermal expansion of the two substrates, occurring in the finished hybrid semiconductor structure.

DRAWINGS

The invention will be described in detail by means of the drawings.

Figure 2:
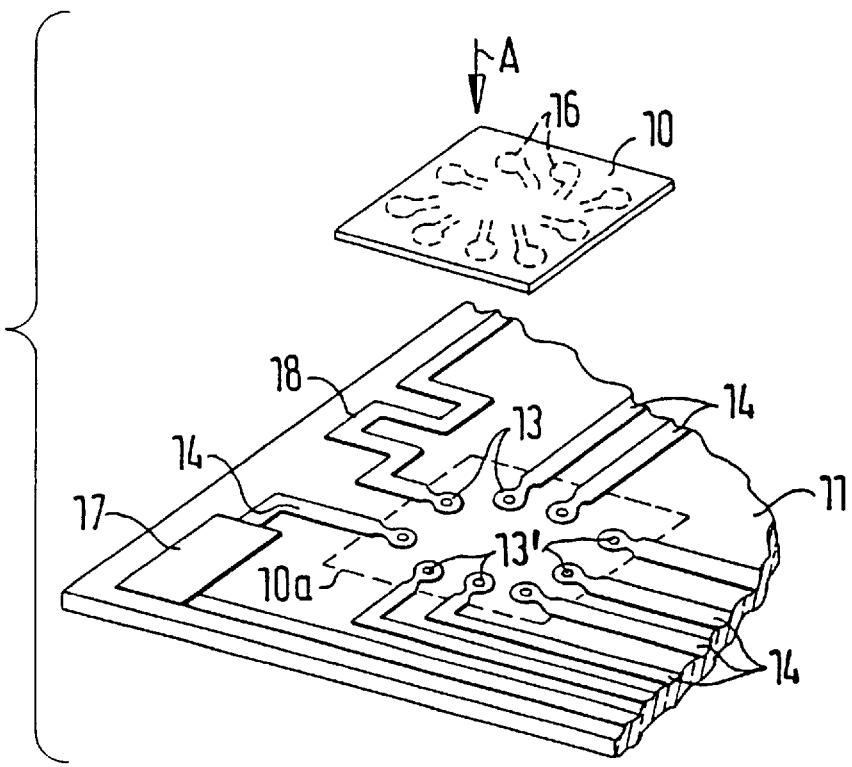
Figure 3:
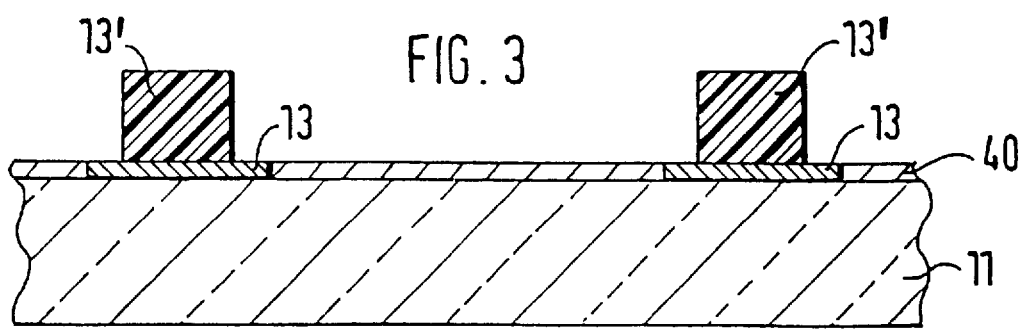
Figure 4A:
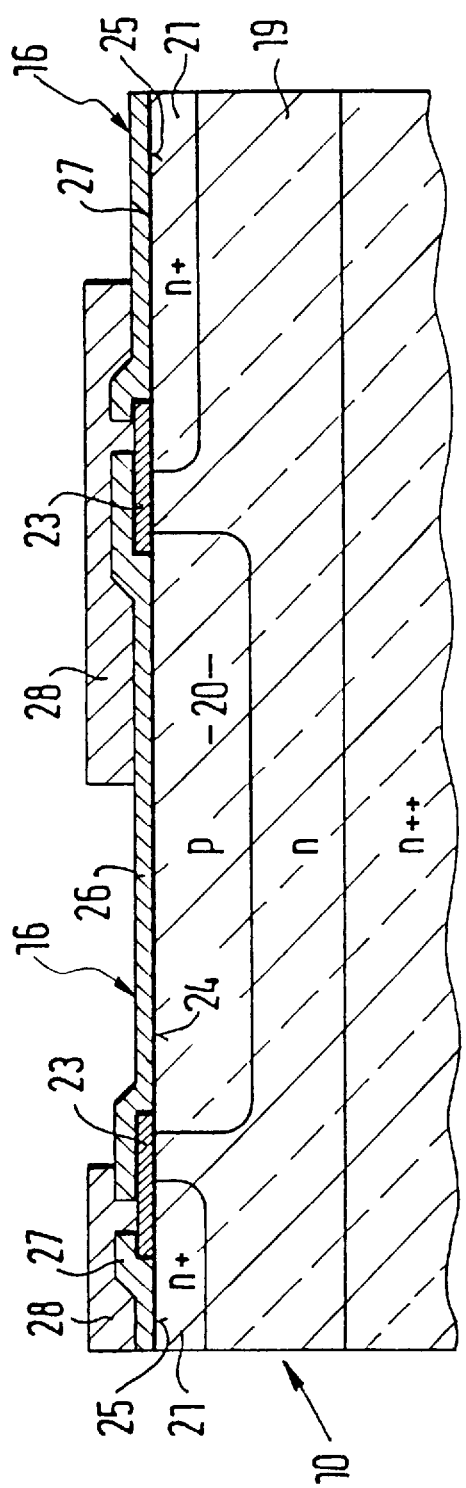
Figure 4B:
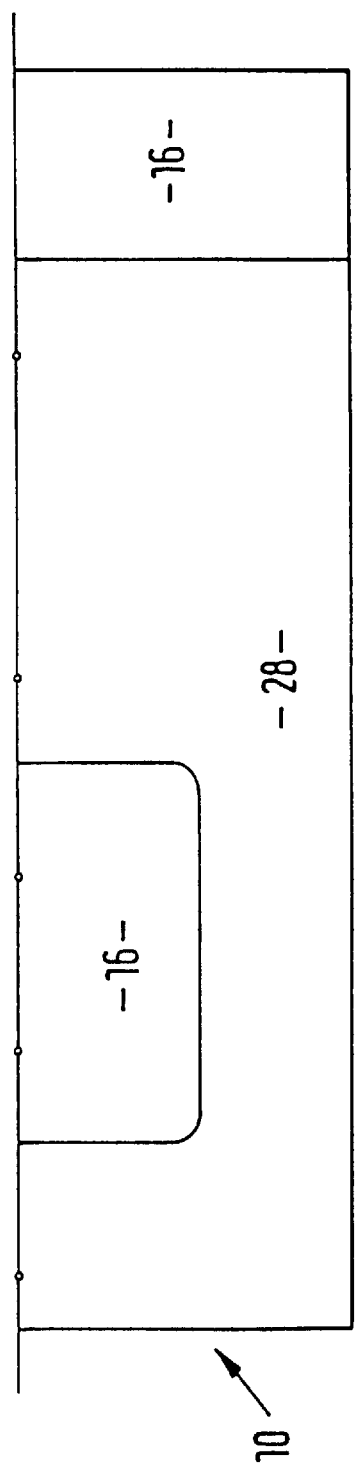
Figure 5:
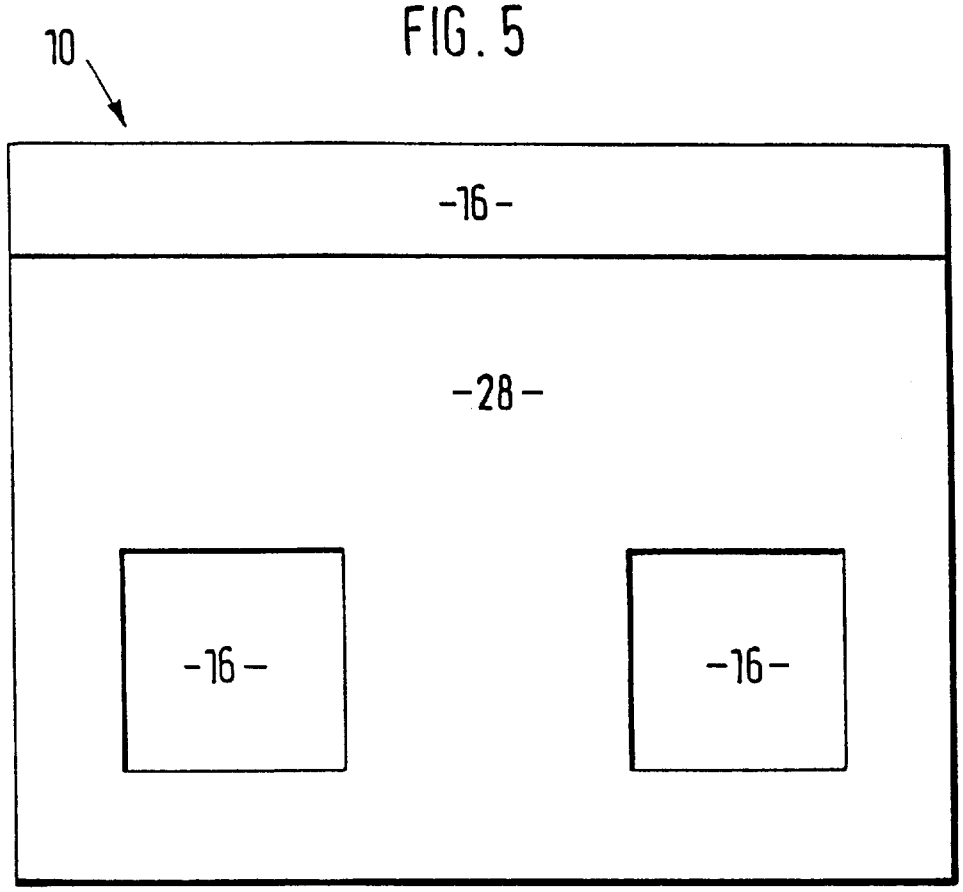
Figure 6:
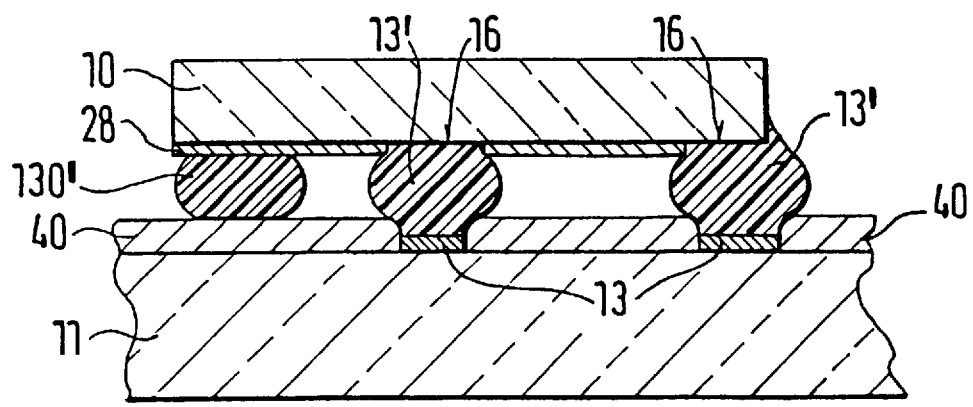

FIG. 1 is a simplified sectional view of a part of a known hybrid semiconductor structure produced according to flip-chip technology, FIG. 2 is a perspective view of a portion of a hybrid semiconductor structure of the invention prior to placing the semiconductor chip or semiconductor wafer substrate on the support plate substrate, FIG. 3 is a sectional view of a support plate substrate prepared for connecting, FIG. 4a is a sectional view of a semiconductor chip substrate formed as a diode and prepared for connecting, FIG. 4b is a top view of the semiconductor chip substrate in accordance with FIG. 4a, cut along the bisecting line, FIG. 5 is a top view of a semiconductor chip substrate formed as a transistor and prepared for connecting, FIG. 6 a schematic sectional view of a hybrid semiconductor structure in which the two substrates are aligned with the connector spots in relation to each other and glued to each other.

DESCRIPTION OF THE INVENTION

FIG. 1 shows a section of the hybrid semiconductor structure produced in accordance with flip-chip technology, known from U.S. Pat. No. 3,303,393, Hymes et al. In this case the connection of the semiconductor chip substrate 10 on the support plate substrate 11 is formed here by spherical metallic contacts 12 disposed on the metallic connector spots, not shown in FIG. 1, of the semiconductor chip substrate 10. The spherical metallic contacts 12, which consist of lead-zinc soft solder, are soldered to the metallic chip connector spots, not shown, of the semiconductor chip substrate 10 and to the associated metallic support plate connector spots 13 of the support plate substrate 11 by using lead-zinc soft solder. Each of the metallic support connector spots 13 represents the end section of a strip conductor 14 of a circuit pattern which has been applied to the support plate substrate 11.

FIG. 2 shows a perspective view of a section of a semiconductor structure in accordance with the invention prior to placing the semiconductor chip or semiconductor wafer substrate 10 on the support plate substrate 11, which takes place in the direction of the arrow A in FIG. 2. The place on which the semiconductor chip or semiconductor wafer substrate 10 is positioned during gluing on the support plate substrate 11 is indicated by dashed lines 10a shown on the support plate substrate 11. The substrate 10 in FIG. 2 has a number of chip connector spots 16 on its underside, which are also indicated in FIG. 2 by dashed lines. In the area outside of the connector spots 16 a passivation layer, not shown in FIG. 2, has been applied to the underside of the substrate 10 having the said chip connector spots 16. The support connector spots on the support plate substrate 11 have again been indicated by 13, the associated strip conductors with 14 in FIG. 2. A thick film resistor or a thin film resistor is indicated in FIG. 2 at 17 or 18 as a component of a circuit pattern of the support plate substrate 11. A passivation layer, not shown in FIG. 2, has been placed on the support plate substrate 11 in the area outside of the support connector spots 13. To be able to make the electrically conductive connection between the metallic connector spots 16 of the semiconductor chip or semiconductor wafer substrate 10 and the metallic connector spots 13 of the support plate substrate 11, electrically conducting adhesive layers 13' (FIG. 3) have been applied to each of the connector spots 13, which have been produced in accordance with a screen printing process.

In the course of placing the semiconductor chip or semiconductor wafer substrate 10 on the support plate substrate 11 into the position indicated by dashed lines in FIG. 2, the mechanically firm and electrically conducting connection between the metallic chip connector spots 16 of the substrate 10 and the metallic support connector spots 13 of the substrate 11 are made in that the said connector spots 16 and 13 are glued together by means of the adhesive layers 13' produced in accordance with the screen printing process.

A section through the support plate substrate 11 of FIG. 2 is shown in FIG. 3, which bisects two support connector spots 13 which are located next to each other. A passivation layer 40 has been applied over the entire surface of the support plate substrate 11 in the area outside the support connector spots 13. The electrically conductive adhesive layers 13' have been selectively applied in accordance with the screen printing process in the area of the support connector spots 13 on the support plate substrate 11, provided with the passivation layer 40 and having the circuit pattern. It can be seen that the adhesive layers 13' do not completely cover each one of the support connector spots 13.

The composition of a semiconductor chip or semiconductor wafer substrate 10 which can be employed in the method of the invention will first be explained by means of FIGS. 4a and 4b with the help of an exemplary embodiment of a semiconductor chip substrate, which is formed as a diode produced by planar technology. However, the invention is not limited to a method for producing a hybrid semiconductor structure with a semiconductor chip substrate formed in this way. Instead, the invention is suitable and has the purpose to change the known methods of the flip-chip technology in such a way that they can be extended to hybrid semiconductor structures containing semiconductor chip or semiconductor wafer substrates with particularly large surfaces, such a transistors, integrated circuits or semiconductor controlled rectifiers, that is, SCRs.

A p-conductive anode zone 20 and, around this anode zone, an $n^+$-doped annularly-shaped cathode zone 21 was diffused from the surface of a disk-shaped semiconductor body 19 of n-type conductivity consisting of monocrystalline silicon—an inverse layer sequence is also conceivable—. As a result of these diffusion processes, a silicon oxide layer 23 is formed on the said surface of the semiconductor body 19. Contact windows 24 or 25 are etched into the silicon oxide layer 23 for connecting the anode zone 20 and the cathode zone 21. In this case the contact window 25 annularly surrounds the contact window 24. A metal layer 26 has been applied to the anode zone 20 in the area of the contact window 24, a metal layer 27 on the cathode zone in the area of the annularly-formed contact window 25. The ends of the metal layers 26, 27 also extend a short distance over the silicon oxide layer 23. The metal layers 26, 27 can consist of metals such as aluminum, nickel or gold or of alloys of these metals with other metals. In this case a particularly suitable alloy consists of an aluminum-nickel-silver alloy.

A passivation layer 28 has been applied to the semiconductor body 19 provided with the silicon oxide layer 23 and the metal layers 26, 27, for example by means of photomasking techniques. The passivation layer 28 is used for the additional passivation of the parts of the silicon oxide layer 23 which are not covered by the metal layers 26, 27, and also for defining the surface extension of the chip connector spots 16, in that those surface areas of the metal layers 26, 27 which are not intended to be used for the exterior chip connection, are covered by the passivation layer 28. Thus, the parts of the metal layers 26, 27 not covered by the passivation layer 28 represent the chip connector spots 16.

A semiconductor chip substrate 10 in the form of a transistor, prepared for connection, is shown in FIG. 5 in a top view. Here, too, the chip connector spots 16 are defined with the aid of the passivation layer 28 as partial areas of the metal layer not covered by the passivation layer, with which the corresponding zones (emitter, bare and collector) of the transistor are connected.

Production of the hybrid semiconductor structure takes place in the following manner:

First, electrically conductive adhesive layers 13' are applied by means of the screen printing process within the area of the support connector spots 13 on the support plate substrate 11 which was provided with the circuit pattern and the passivation layer 40. Then the semiconductor chip or semiconductor wafer substrate 10 is placed on the support plate substrate 11, prepared in this manner, in such a way that the chip connector spots 16 come into contact with the support connector spots 13 by means of the adhesive layers 13'. The chip connector spots 16 are glued to the support connector spots 13 with the aid of the adhesive layers 13' by pressing the two substrates 10, 11 together (FIG. 6).

The moist adhesive layers 13' are spread out by the placement pressure of the "face-down" mounted semiconductor chip substrate 10 far enough so that the entire surfaces of the connector spots 13, 16 are moistened, with sufficient distance to connector spots of different potential being preserved. After hardening of the adhesive layers 13' it is possible in this way to realize a sufficiently thin layer thickness (for example, d=45 Mm in a circular connector spot with r>280 Mm) with an Rth<1.3 K/W typical for a semiconductor.

The cohesion of the moist conductive adhesive counteracts the placement pressure. In components with few contacts (for example diodes, transistors) this effect can be increased and stabilized with additional blind contacts if the connector spots 16 or 13 should not be evenly distributed over the surface of the semiconductor chip or semiconductor wafer substrates 10 or the support plate substrates 11 and that therefore would be a danger that the two substrates 10, 11 are tilted when pressed together. The blind contacts consist in applying, in addition to the adhesive layers 13' used for connection, one or several further adhesive layers 130', made together with the adhesive layers 13' by the screen printing process, to the surface of the support plate substrate 11 in the areas outside of the support connector spots 13. The blind contacts made in this way act in the way of spacers during the pressing together of the two substrates, so that a placement pressure is generated, which is evenly distributed over the totality of the contacts. Furthermore, additional transfer spots for heat dissipation are created by the blind contacts.

Although in components with few contacts the surface requirements determined by the minimal sizes of the connector spots and distances are slightly greater than in the customary "face-up"-mounted semiconductors, taking into consideration the bond connections required in that case, they are considerably less. With multicontact components, with an appropriate IC design, the exterior connections can be disposed so that they are distributed over the surface in a matrix-like manner. In that case the space requirements are considerably less in comparison to peripherally arranged "bond pads" and are only determined by the possible connection density of the strip conductors on the substrate.

The support plate substrate can consist of aluminum oxide ($Al_1O_3$) or aluminum nitride (AlN) or of glass or any suitable layered structure (for example tape on substrate, multilayer), by means of which a sufficiently level surface can be generated.

We claim:

1. A composite hybrid semiconductor structure comprising a support plate substrate (11);

a plurality of support connector spots (13) located on a surface of the support plate substrate (11);

a semiconductor chip or semiconductor wafer substrate (10);

a plurality of chip connector spots (16) located on a surface of the semiconductor chip or semiconductor wafer substrate (10);

thermally and electrically conductive adhesive layer elements (13') located between the areas of the support connector spots (13) on the surface of the support plate substrate (11) and said chip connector spots (16) on the surface of the semiconductor chip or semiconductor wafer substrate (10), said thermally and electrically conductive adhesive layer elements (13') forming an electrically conductive and mechanically firm connection; and at least one further thermally and electrically conductive adhesive layer portion (130') located between the surface of the support plate substrate (11) and the surface of the semiconductor chip or semiconductor wafer substrate (10) in an area outside of the areas of the support connector spots (13) to improve the mechanically firm connection of said substrates (10, 11) and dissipation of heat arising in operation of said semiconductor structure.

* * * * *